(12) United States Patent
Cideciyan et al.

(10) Patent No.: US 9,606,868 B2
(45) Date of Patent: Mar. 28, 2017

(54) ENCODING AND WRITING OF DATA ON MULTITRACK TAPE

(71) Applicant: International Business Machines Corporation, Armonk, NY (US)

(72) Inventors: Roy D. Cideciyan, Rueschlikon (CH); Simeon Furrer, Altdorf (CH); Mark A. Lantz, Thalwil (CH); Keisuke Tanaka, Tokyo (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/702,861

(22) Filed: May 4, 2015

(65) Prior Publication Data

US 2016/0329913 A1    Nov. 10, 2016

(51) Int. Cl.
| | |
|---|---|
| *H03M 13/00* | (2006.01) |
| *G06F 11/10* | (2006.01) |
| *G06F 3/06* | (2006.01) |
| *H03M 13/15* | (2006.01) |
| *H03M 13/29* | (2006.01) |

(52) U.S. Cl.
CPC .......... *G06F 11/1076* (2013.01); *G06F 3/064* (2013.01); *G06F 3/0619* (2013.01); *G06F 3/0682* (2013.01); *H03M 13/1515* (2013.01); *H03M 13/2909* (2013.01)

(58) Field of Classification Search
CPC ..... G06F 11/1076; G06F 3/064; G06F 3/0682
See application file for complete search history.

(56) References Cited

U.S. PATENT DOCUMENTS

| | | | |
|---|---|---|---|
| 5,463,660 A | 10/1995 | Fukasawa et al. | |
| 6,732,325 B1* | 5/2004 | Tash | H03M 13/15 714/785 |
| 7,362,734 B1* | 4/2008 | Samaras | H04B 7/2643 370/336 |

(Continued)

OTHER PUBLICATIONS

Anonymous, Expanded Sub Data Set for Magnetic Tape Recording. IP.com Electronic Publication No. 000223249, Nov. 13, 2012, pp. 1-6.

(Continued)

*Primary Examiner* — Esaw Abraham
(74) *Attorney, Agent, or Firm* — Daniel P. Morris; Otterstedt, Ellenbogen & Kammer, LLP

(57) ABSTRACT

A block of data is partitioned into a plurality of sub-blocks each including a logical array having rows and columns of data symbols, encoded using a row linear block code and a column linear block code. Each product codeword includes a logical array of code symbols having rows which include respective row codewords and columns which include respective column codewords. The product codewords are encoded by encoding groups of L symbols, using a rate-L/(L+M) linear block code to produce a plurality of (L+M)-symbol codewords which are logically arranged in nQ encoded blocks (where n is an integer greater than zero). Each of the nQ encoded blocks includes an array having rows and columns of code symbols in which each column includes a codeword of the column code.

7 Claims, 11 Drawing Sheets

(56) References Cited

U.S. PATENT DOCUMENTS

| | | | | |
|---|---|---|---|---|
| 7,386,780 | B2* | 6/2008 | Krachkovsky | G11B 20/10009 714/770 |
| 8,095,854 | B2* | 1/2012 | Eroz | H03M 13/1111 714/758 |
| 8,108,752 | B2 | 1/2012 | Tanaka | |
| 8,276,045 | B2 | 9/2012 | Cideciyan et al. | |
| 8,300,687 | B1* | 10/2012 | Eliezer | G04G 7/02 375/238 |
| 8,332,716 | B2* | 12/2012 | Jego | H03M 13/2771 714/755 |
| 8,340,211 | B2* | 12/2012 | Josiam | H04L 1/0057 341/173 |
| 8,370,700 | B2* | 2/2013 | Xu | H03M 13/116 714/752 |
| 8,599,959 | B2* | 12/2013 | Krachkovsky | H04L 1/0042 375/295 |
| 8,627,187 | B2* | 1/2014 | Chappaz | H03M 13/23 714/786 |
| 8,762,805 | B2 | 6/2014 | Cideciyan et al. | |
| 9,231,622 | B2* | 1/2016 | Wang | H03M 13/152 |
| 2005/0273688 | A1 | 12/2005 | Argon | |
| 2008/0034272 | A1 | 2/2008 | Wu et al. | |
| 2013/0326306 | A1 | 12/2013 | Cideciyan et al. | |
| 2014/0108881 | A1 | 4/2014 | Blaum et al. | |
| 2014/0189461 | A1 | 7/2014 | Cideciyan et al. | |

OTHER PUBLICATIONS

Suayb S. Arslan, MDS Product Code Performance Estimations Under Header CRC Check Failures and Missing Syncs. IEEE Transactions on Device and Materials Reliability, vol. 14, No. 3, Sep. 2014, pp. 921-930.

Roy D. Cideciyan et al. Unpublished U.S. Appl. No. 14/984,086, filed Dec. 30, 2015, Encoding and Writing of Data on Multitrack Tape, pp. 1-20 plus 11 sheets drawings.

Roy D. Cideciyan et al. Unpublished U.S. Appl. No. 14/703,756, filed May 4, 2015, Decoding Data Stored With Three Orthogonal Codewords, pp. 1-62 plus 20 sheets drawings.

List of IBM Patents or Patent Applications Treated As Related.

Robert G. Gallagher, "Low-Density Parity-Check Codes," (1963) p. 1-90 see especially p. 6 (http://web.mit.edu/gallager/www/pages/ldpc.pdf, accessed Sep. 1, 2016).

William A. Geisel, "Tutorial on Reed-Solomon Error Correction Coding," NASA Technical Memorandum 102162 (1990) p. i-x and 1-129 see especially pp. x, 33-43.

* cited by examiner

| Sub Data Set Number | Row within Sub Data Set | | | | | | |
|---|---|---|---|---|---|---|---|
| | 0 | 1 | 2 | ... | 189 | 190 | 191 |
| 0 | 0 | 64 | 128 | ... | 12096 | 12160 | 12224 |
| 1 | 1 | 65 | 129 | ... | 12097 | 12161 | 12225 |
| 2 | 2 | 66 | 130 | ... | 12098 | 12162 | 12226 |
| 3 | 3 | 67 | 131 | ... | 12099 | 12163 | 12227 |
| 4 | 4 | 68 | 132 | ... | 12100 | 12164 | 12228 |
| 5 | 5 | 69 | 133 | ... | 12101 | 12165 | 12229 |
| 6 | 6 | 70 | 134 | ... | 12102 | 12166 | 12230 |
| 7 | 7 | 71 | 135 | ... | 12103 | 12167 | 12231 |
| 8 | 8 | 72 | 136 | ... | 12104 | 12168 | 12232 |
| 9 | 9 | 73 | 137 | ... | 12105 | 12169 | 12233 |
| 10 | 10 | 74 | 138 | ... | 12106 | 12170 | 12234 |
| 11 | 11 | 75 | 139 | ... | 12107 | 12171 | 12235 |
| 12 | 12 | 76 | 140 | ... | 12108 | 12172 | 12236 |
| 13 | 13 | 77 | 141 | ... | 12109 | 12173 | 12237 |
| ... | ... | ... | ... | ... | ... | ... | ... |
| 50 | 50 | 114 | 178 | ... | 12146 | 12210 | 12274 |
| 51 | 51 | 115 | 179 | ... | 12147 | 12211 | 12275 |
| 52 | 52 | 116 | 180 | ... | 12148 | 12212 | 12276 |
| 53 | 53 | 117 | 181 | ... | 12149 | 12213 | 12277 |
| 54 | 54 | 118 | 182 | ... | 12150 | 12214 | 12278 |
| 55 | 55 | 119 | 183 | ... | 12151 | 12215 | 12279 |
| 56 | 56 | 120 | 184 | ... | 12152 | 12216 | 12280 |
| 57 | 57 | 121 | 185 | ... | 12153 | 12217 | 12281 |
| 58 | 58 | 122 | 186 | ... | 12154 | 12218 | 12282 |
| 59 | 59 | 123 | 187 | ... | 12155 | 12219 | 12283 |
| 60 | 60 | 124 | 188 | ... | 12156 | 12220 | 12284 |
| 61 | 61 | 125 | 189 | ... | 12157 | 12221 | 12285 |
| 62 | 62 | 126 | 190 | ... | 12158 | 12222 | 12286 |
| 63 | 63 | 127 | 191 | ... | 12159 | 12223 | 12287 |

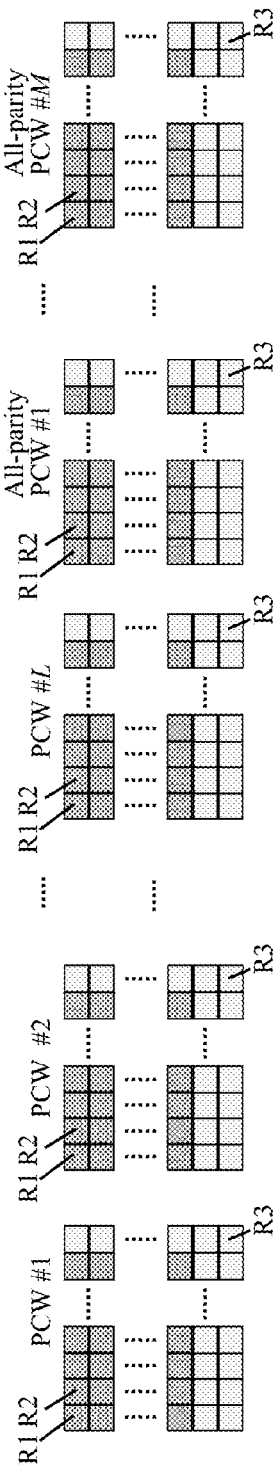
Figure 15
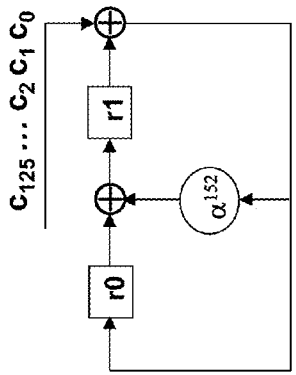
Figure 16
Packets with cyclic rotation of row codeword symbols:
Figure 17

ENCODING AND WRITING OF DATA ON MULTITRACK TAPE

BACKGROUND

The present invention relates generally to writing of data on multitrack tape, and more specifically to encoding and writing of blocks of data on multitrack tape in linear tape drives.

In linear tape drives such as LTO (Linear Tape Open) drives and enterprise tape drives, data is written in multiple parallel data tracks extending along the length of the magnetic tape. The write head includes Q write elements for writing data simultaneously in Q data tracks. In current 16-channel LTO drives Q=16 tracks are written simultaneously, and in current 32-channel LTO drives Q=32 tracks are written simultaneously.

The smallest unit for appending or overwriting data on magnetic tape is known as a Data Set (DS). Data Sets in tape storage are currently 3 MB to 6 MB and are expected to increase to 12 MB in the near future. Blocks of user data received from a host interface are encoded and formatted into Data Sets for recording. After preliminary processing, an input block of data is partitioned into sub-blocks. Each of these sub-blocks is protected by a product code. The product code is used to encode rows and columns of a logical two-dimensional array containing the data symbols in a sub-block. Each row of data symbols is encoded using a row linear block code (C1 code) and each column is encoded using a column linear block code (C2 code). The resulting product codeword comprises a logical array of code symbols in which the rows/columns are row/column codewords including C1-and C2-parity symbols respectively. Subsets of these product codewords are then combined by column-interleaving to produce respective encoded blocks known as Sub Data Sets (SDSs). There are currently 32 to 64 Sub Data Sets in a Data Set, though there are plans to increase the number of read/write channels Q to 64 allowing 128 SDSs per DS.

The SDSs in a Data Set are subjected to various further processing stages, including formation of packets from rows of the SDSs and interleaving of packets to determine the packet layout on tape. The layout is designed to space different rows of the same SDS, and hence symbols of the column (C2) codewords, over the region of tape in which the DS is written.

It is desired to obtain good error-rate performance on read-back of data from tape while minimizing overhead due to redundancy introduced by the error-correction codes (ECC). Performance of current linear tape drives is based on an ECC overhead of about 16% due to the C1-and C2-parity symbols.

SUMMARY

According to at least one embodiment of the present invention there is provided a method for writing data in Q parallel data tracks on multitrack tape in a linear tape drive. A block of data is partitioned into a plurality of sub-blocks each comprising a logical array having rows and columns of data symbols. The rows and columns of each sub-block are encoded using a row linear block code and a column linear block code respectively to produce a product codeword. Each product codeword comprises a logical array of code symbols having rows which comprise respective row codewords and columns which comprise respective column codewords. The product codewords are encoded by encoding groups of L symbols, each from a respective one of L product codewords, using a rate-L/(L+M) linear block code to produce a plurality of (L+M)-symbol codewords which are logically arranged in nQ encoded blocks (where n is an integer greater than zero). Each of the nQ encoded blocks comprises an array having rows and columns of code symbols in which each column comprises a codeword of the column code. The symbols of each of the (L+M)-symbol codewords are distributed over corresponding rows of the nQ encoded blocks. Packets are produced from the encoded blocks such that each packet comprises a row of an encoded block, and the packets for the block of data are written in the Q parallel data tracks.

The embodiments described above offer improved error-rate performance in linear tape drives with minor, or even no, increase in ECC overhead. Indeed, total ECC overhead may even be reduced. The rate-L/(L+M) coding across product codewords offers improved protection against errors in a Data Set, inhibiting failures to decode Data Sets which cause permanent errors resulting in data loss. Addition of the rate-L/(L+M) coding stage is predicated on the realization that coding overhead can be balanced across the C1, C2 and rate-L/(L+M) codes, thereby to substantially maintain or even reduce total ECC overhead compared to current tape drives while obtaining performance benefits. Moreover, the nQ encoded blocks obtained by encoding the product codewords can be processed as Sub-Data Sets in current systems, thus maintaining conformity and avoiding significant processing changes.

Another embodiment of the invention provides a linear tape drive for writing data in Q parallel data tracks on multitrack tape. The tape drive includes a data partitioner which is operable to partition a block of data into a plurality of sub-blocks each comprising a logical array having rows and columns of data symbols. A product encoder of the drive is operable to encode the rows and columns of each sub-block using a row linear block code and a column linear block code respectively to produce a product codeword comprising a logical array of code symbols having rows which comprise respective row codewords and columns which comprise respective column codewords. The drive also includes rate-L/(L+M) encoder apparatus operable to encode the product codewords by encoding groups of L symbols, each from a respective one of L product codewords, using a rate-L/(L+M) linear block code to produce a plurality of (L+M)-symbol codewords which are logically arranged in nQ encoded blocks, where n is an integer greater than zero. Each of the nQ encoded blocks comprises an array having rows and columns of code symbols in which each column comprises a codeword of the column code. The symbols of each of the (L+M)-symbol codewords are distributed over corresponding rows of the nQ encoded blocks. A packet formatter of the drive is operable to produce packets from the encoded blocks such that each packet comprises a row of an encoded block. The drive has a write-head comprising Q write elements operable to write the packets for the block of data in the Q parallel data tracks.

In preferred embodiments, the packets for the block of data are interleaved and the interleaved packets are output to Q write-channels for writing in respective data tracks. Advantageously, the interleaving is performed such that the rows of each encoded block are spaced over a region of the tape in which the block of data is written, and such that corresponding rows of the nQ encoded blocks are spaced over said region. This distributes symbols of the (L+M)-symbol codewords over the tape surface, protecting these codewords against burst errors, in addition to the distribution of column (C2) codeword symbols.

In an embodiment, the step of encoding the product codewords comprises combining (preferably by column-interleaving) the column codewords in each of L subsets of the product codewords to produce L of the encoded blocks, and encoding groups of L corresponding symbols of respective column codewords, each from a respective one of the L encoded blocks, using the rate-L/(L+M) code to produce M=(nQ−L) all-parity encoded blocks each containing one parity symbol of each of the (L+M)-symbol codewords. In this embodiment the rate-L/(L+M) encoding is applied to L encoded blocks, e.g. L SDSs, giving a coding granularity of one such block.

In another embodiment, the block of data is partitioned into L sub-blocks which are encoded to produce L product codewords. The step of encoding the product codewords then comprises encoding the L product codewords using the rate-L/(L+M) code to produce M all-parity product codewords each containing one parity symbol of each of the (L+M)-symbol codewords. The column codewords in each of nQ subsets of the L+M product codewords are combined, preferably by column-interleaving, to produce a respective encoded block. This embodiment applies the rate-L/(L+M) encoding to L product codewords, giving a coding granularity of one product codeword. In particularly efficient implementations, the step of encoding the L product codewords comprises encoding groups of L corresponding symbols of respective said column codewords to produce M corresponding symbols of respective column codewords in respective said all-parity product codewords.

Preferred embodiments may include cyclically rotating symbols of codewords of the row (C1) code in each row of each encoded block to produce a relative cyclical shift between the row codewords in that row. This distributes errors in the (L+M)-symbol codewords, further improving protection against burst errors.

Embodiments of the invention will be described in more detail below, by way of illustrative and non-limiting example, with reference to the accompanying drawings.

BRIEF DESCRIPTION OF THE DRAWINGS

FIGS. 12 and 13 show part of an interleave table indicating layout of packets in Q=32 parallel tape tracks in one example of the interleave process;

FIGS. 14a and 14b show part of another interleave table indicating layout of packets in Q=64 parallel tape tracks in another example of the interleave process;

FIG. 15 illustrates rate-L/(L+M) encoding of product codewords in another embodiment;

FIG. 16 shows another embodiment of a rate-L/(L+M) encoder;

FIG. 17 illustrates packet structures with cyclic rotation of row codeword symbols.

DETAILED DESCRIPTION

Aspects of the present invention are described herein with reference to block diagrams of methods, apparatus (systems), and computer program products according to embodiments of the invention. It will be understood that each block or combinations of blocks in the block diagrams may be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the block diagram block or blocks.

The block diagrams in the figures illustrate the architecture, functionality, and operation of possible implementations of systems, methods, and computer program products according to various embodiments of the present invention. In this regard, each block in the block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block and combinations of blocks in the block diagrams can be implemented by special purpose hardware-based systems that perform the specified functions or acts or carry out combinations of special purpose hardware and computer instructions.

In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Figure 1:
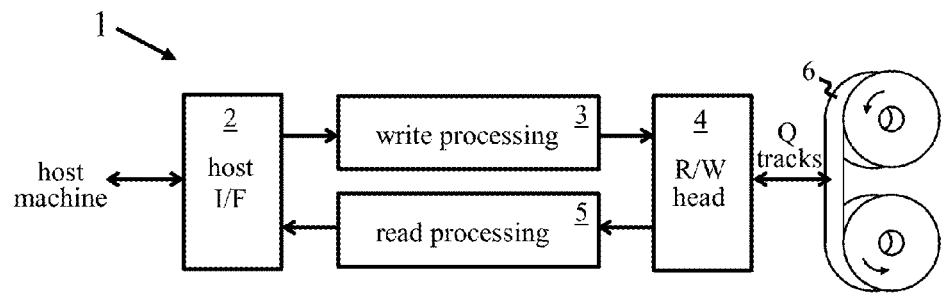
FIG. 1 is a schematic representation of a linear tape drive embodying the invention.

FIG. 1 is a high-level block diagram of a linear tape drive 1 in which methods embodying the invention may be employed. The drive 1 corresponds generally to an LTO drive, whereby the structure and operation of drive 1 is generally as defined for LTO drives except where described differently below. The drive 1 includes a host interface 2, write processing apparatus 3, a read/write (R/W) head 4, and read processing apparatus 5. Data to be written to multitrack tape 6 is received from a host machine by host interface 2 and processed by write apparatus 3. The write processing includes various encoding and formatting stages described below. The processed data is supplied to read/write head 4 which writes data simultaneously to Q parallel data tracks on tape 6. On readback, the read data is supplied by read/write head 4 to read circuitry 5. This performs read processing including decoding and error-correction operations to recover the host data for return to the host machine via interface 2.

Figure 2:
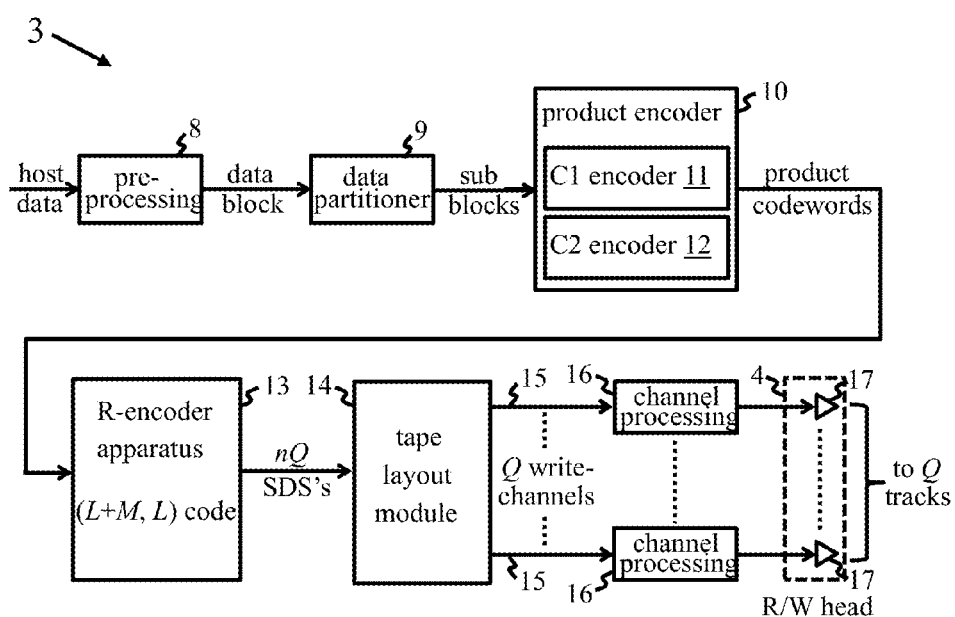
FIG. 2 is a schematic block diagram of write processing apparatus in the FIG. 1 drive.

FIG. 2 is a more detailed schematic of write processing apparatus 3. This includes a pre-processing module 8, a data partitioner 9 and a product encoder 10 which comprises a C1 encoder 11 and a C2 encoder 12. The write apparatus also includes rate-L/(L+M) encoder apparatus 13, referred to as "R-encoder apparatus" in the following, for implementing a rate-L/(L+M) code (also referred to as a "(L+M, L) code"). Write apparatus 3 further includes a tape layout module 14 which provides an output to Q parallel write-channels 15. Each write-channel 15 contains a channel processing module 16 from which processed data is supplied to a respective one of Q write elements 17 in read/write head 4. Each write element 17 writes data to a respective one of the Q parallel data tracks addressed in a write operation. These Q tracks are typically a subset of the total number of parallel tracks on tape 6 whereby different sets of Q tracks can be addressed by varying head position across the tape. Head 4 also includes Q read elements (not shown), typically in a stacked arrangement with write elements 17, to permit simultaneous reading of written data for verification purposes.

In a write operation, write processing apparatus 3 processes and formats host data into Data Sets for recording. The host interface 2 supplies data to be recorded to pre-processing module 8. Module 8 performs various preliminary processing operations, typically including data compression and addition of cyclic redundancy check codes, and optionally data encryption. After preliminary processing, module 8 outputs a block of data for recording as a Data Set. Data partitioner 9 partitions this data block into a plurality of sub-blocks. The resulting sub-blocks, each of which comprises a logical array having rows and columns of data symbols, are then output to product encoder 10. Data partitioner 9 may be implemented as a buffer memory, e.g. in the form of one or more registers, DRAM, SRAM or other convenient memory structures, for receiving and storing symbols of the input data block and outputting symbols of the sub-blocks (serially or in parallel) to product encoder 10.

The product encoder 10 encodes each input sub-block into a product codeword. Specifically, the C1 encoder 11 in product encoder 10 encodes the rows of each sub-block into respective row codewords using a row linear block code (C1 code). Similarly, the C2 encoder 12 encodes the columns of each sub-block into respective column codewords using a column linear block code (C2 code). This process is described further below. In preferred embodiments, the C1 and C2 codes are Reed Solomon codes. Other linear block codes, including for example Low Density Parity Check (LDPC) codes or Bose-Chaudhuri-Hocquenghem (BCH) codes, may be employed in other embodiments. While in general the C1 and C2 encoders can be implemented in hardware or software or a combination thereof, RS encoders can be efficiently implemented as linear-feedback shift registers (LFSRs). LSFRs can be constructed in known manner to implement desired RS codes.

Figure 3:
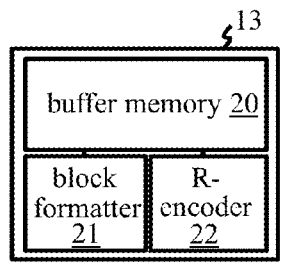
FIGS. 3 and 4 are schematic block diagrams of encoder apparatus and a tape layout module respectively in the FIG. 2 apparatus.

Product encoder 10 outputs the product codewords produced for the current data block to R-encoder apparatus 13. FIG. 3 shows the components of the R-encoder apparatus 13 as a buffer memory 20, a block formatter 21 and a rate-L/(L+M) encoder ("R-encoder") 22. Block formatter 21 comprises logic for controlling storage and readout of code symbols in buffer memory 20, and for supply of code symbols to R-encoder 22. R-encoder 22 encodes groups of L symbols using a rate-L/(L+M) linear block code ("R-code") to produce respective (L+M)-symbol codewords as detailed below. The resulting (L+M)-symbol codewords are stored in memory 20 and are logically arranged in nQ encoded blocks, or Sub Data Sets (SDSs), where n is an integer greater than zero. Buffer memory 20 may be implemented by one or more registers, DRAM or SRAM modules or other convenient memory structures. Block formatter 21 and R-encoder 22 may in general comprise hardware, software or a combination of hardware and software components for implementing the functionality described. The R-code is a Reed-Solomon (RS) code in preferred embodiments, and the R-encoder is conveniently implemented as a LFSR. Other linear block codes such as LDPC or BCH codes may be used in other embodiments.

Figure 4:
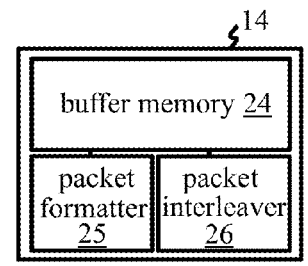

The R-encoder apparatus 13 supplies the nQ Sub Data Sets to tape layout module 14. FIG. 4 shows the components of the layout module 14 as a buffer memory 24, a packet formatter 25 and a packet interleaver 26. The input SDSs are stored in buffer memory 24. Buffer memory 24 may be implemented in like manner to buffer memory 20 of the R-encoder. In some embodiments, memories 20, 24 may be implemented by the same memory structure. Packet formatter 25 comprises logic for producing packets from rows of the SDSs as described below. The packet interleaver 26 comprises logic for interleaving the packets as detailed below and outputting interleaved packets to the Q data channels 15. The logic of packet formatter 25 and packet interleaver 26 may be implemented as hardware, software or a combination of hardware and software components to perform the functions to be described.

The stream of packets output to each write channel 15 is written along a respective tape track after channel processing in module 16. This typically comprises scrambling and modulation encoding stages as well as insertion of sync patterns for timing recovery on readback.

Operation is described in more detail below for a first embodiment of the write process. This embodiment performs SDS-based R-encoding for a 32-channel drive. Data partitioner 9 partitions the input data block into S sub-blocks, where S=248 in this example. The C1 encoder 11 in product encoder 10 implements a (240, 228, 13) RS code, i.e. a rate 228/240 code permitting correction of 6 symbol errors per C1 codeword. The C2 encoder 12 implements a (192, 168, 25) RS code, i.e. a rate 168/192 code permitting correction of 12 symbol errors per C2 codeword. Operation of product encoder 10 is illustrated schematically in FIG. 5.

Figure 5:
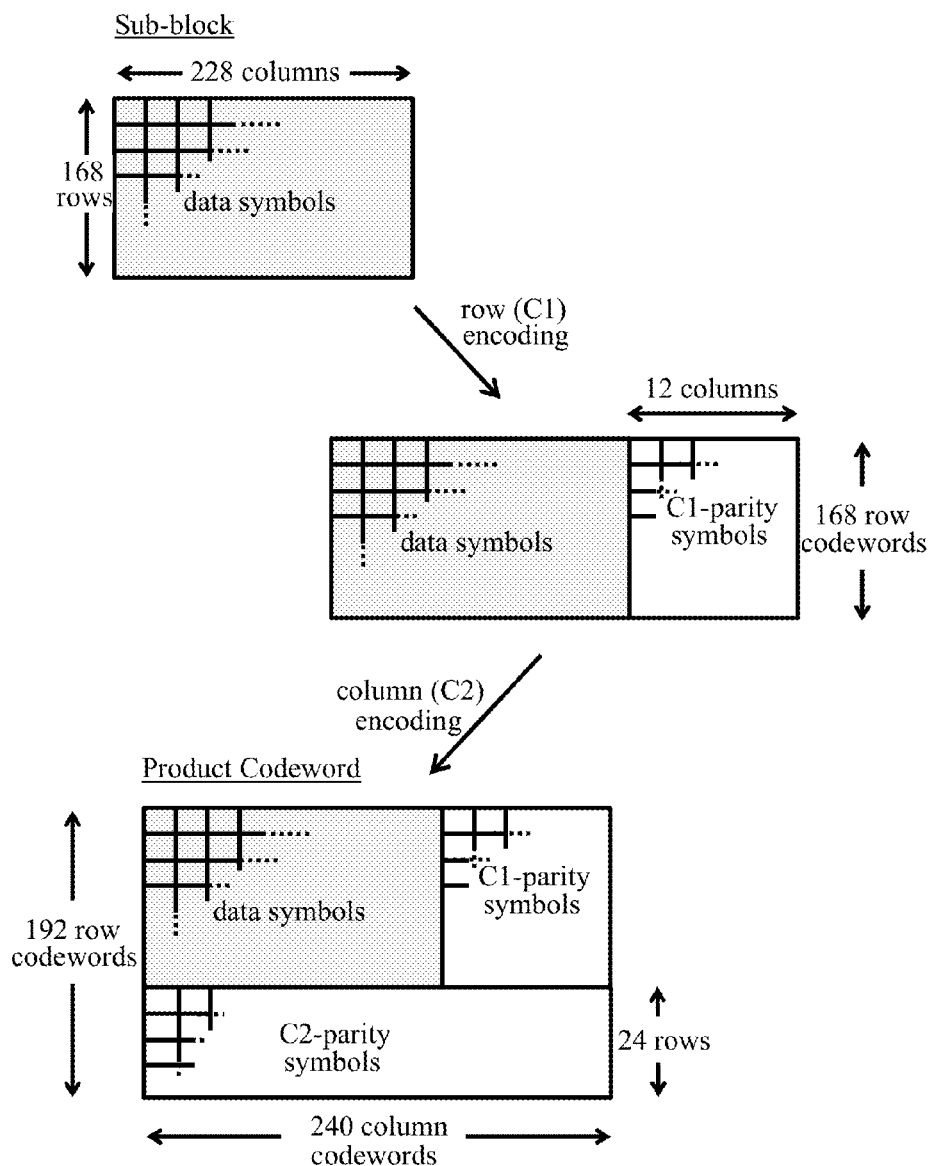
FIG. 5 indicates operation of a product encoder in the FIG. 2 apparatus.

One of the S=248 sub-blocks, comprising a logical array with 168 rows and 228 columns of data symbols, is shown at the top of FIG. 5. C1 encoder 11 encodes each row of the sub-block into a C1 codeword by addition of 12 C1-parity symbols. The resulting array of 168 row codewords is shown in the center of the figure. C2 encoder 12 then encodes each column of the array into a C2 codeword by addition of 24 C2-parity symbols. The resulting product codeword is shown at the bottom of the figure. This comprises a logical array in which the 192 rows comprise respective row (C1) codewords and the 240 columns comprise respective column (C2) codewords. The order of C1 and C2 encoding can be reversed and the resulting product codeword will be identical. In this process, and in general herein, a "row" and "column" of a logical array is a matter of selection according to deemed array orientation, whereby rows and columns are effectively interchangeable herein. Note also that the C1 and C2 encoders may each comprise multiple encoder modules for encoding respective rows/columns of the array in parallel.

Figure 6:
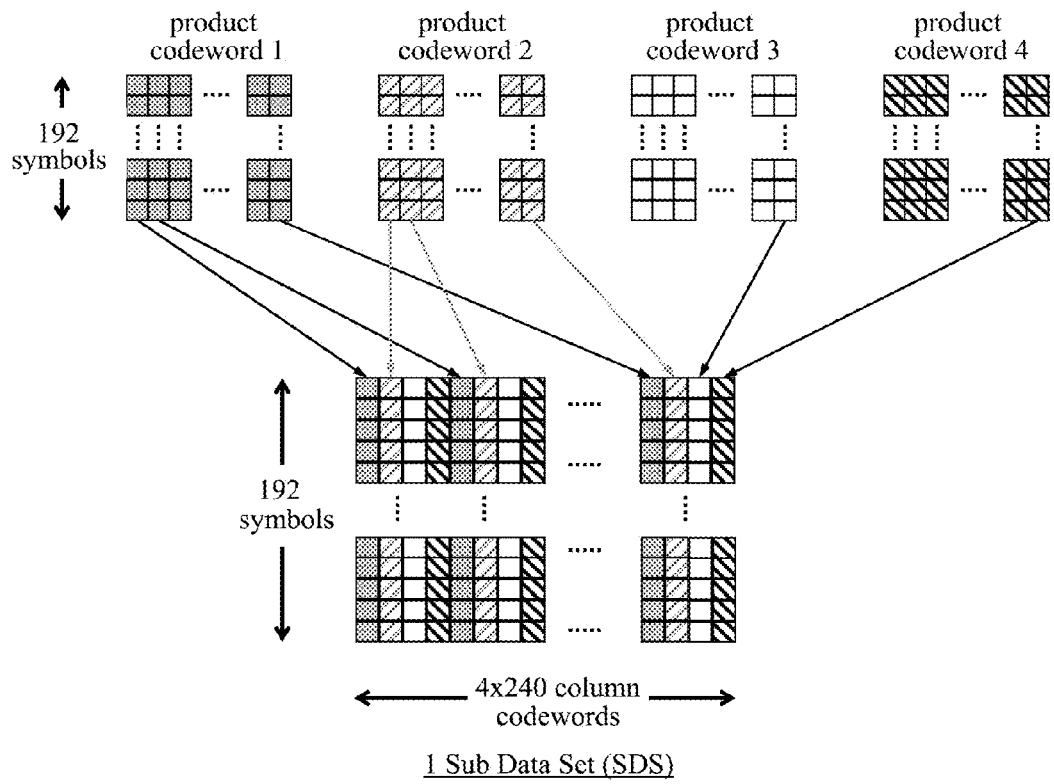
FIG. 6 illustrates interleaving of product codewords to produce encoded blocks in an embodiment of the write process.

Product encoder 10 supplies the resulting S=248 product codewords (PCWs) to R-encoder apparatus 13 for storage in memory 20. The block formatter 21 combines the column codewords in each of L=62 subsets of the 248 PCWs to produce L=62 encoded blocks (SDSs). Subsets of 4 PCWs are thus combined to produce an SDS. In this embodiment, the column codewords in the 4 PCWs are combined by column interleaving the column codewords as illustrated in FIG. 6. This produces an SDS containing 4×240=960 column codewords. The L=62 SDSs produced in this way are encoded by R-encoder 22. R-encoder 22 encodes groups of L symbols, each from a respective one of L product codewords, using the rate-L/(L+M) linear block code (R-code). In particular, the block formatter 21 supplies groups of L corresponding symbols of respective column codewords, each from a respective one of the L SDSs, to R-encoder 22 for encoding into respective (L+M)-symbol R-codewords by addition of M=(nQ−L) R-parity symbols in each case. The R-encoding process is illustrated schematically in FIG. 7 where the symbols of three R-codewords are numbered R1, R2 and R3 respectively. It can be seen that L corresponding symbols of respective column codewords, each from a product codeword in one of the L SDSs, are R-encoded to produce M parity symbols at corresponding positions in M=(nQ−L) all-parity SDSs. Each of the all-parity SDSs thus contains one R-parity symbol of each of the (L+M)-symbol R-codewords. In general, M and n are integers greater than zero. In this example, Q=32, L=62 and n=2, whereby M=64−62=2, and the R-code is a rate-62/64 RS code.

It can be seen that the result of the R-encoding process is to produce a set of 960P R-codewords, each having (L+M)-symbols, where the length of an SDS row is 960 symbols and P is the length of the C2 column code. P=192 in this example. The (960×192) R-codewords are logically arranged in nQ (here 64) encoded blocks (SDSs) which make up the Data Set. Each SDS comprises an array having rows and columns of code symbols in which each column comprises a codeword of the C2 column code. The (L+M) symbols of each of the R-codewords are distributed over corresponding rows of the nQ SDSs, with one R-symbol per SDS in this embodiment.

Figure 8:
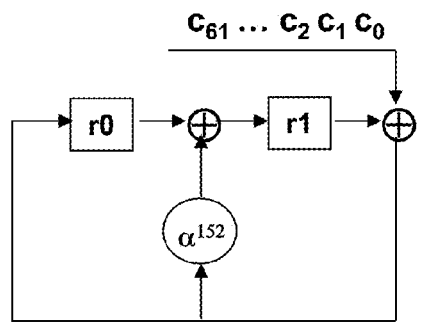
FIG. 8 shows an embodiment of a rate-L/(L+M) encoder.

FIG. 8 shows a linear feedback shift register for implementing R-encoder 22 as a rate-62/64 RS encoder. Calculation in a finite field (also known as a Galois field (GF)) with 256 elements (where a field element is a byte) GF(256) is defined by the primitive polynomial $P(x)=x^8+x^4+x^3+x^2+1$. A primitive element $\alpha$ in GF(256) is $\alpha$=(0 0 0 0 0 0 1 0). The generator polynomial is $G(x)=(x+\alpha^{127})(x+\alpha^{128})=x^2+\alpha^{152}x+1$. The R-parity symbols are generated by processing the requisite symbols through a generator circuit whose registers are set to all-zero byte (0 0 0 0 0 0 0 0) prior to processing. Registers r0 and r1 are 8 bits wide. Symbols (bytes) $c_0, c_1, c_2, \ldots, c_{61}$ are fed sequentially into the encoder. After the requisite symbols have been processed, the content of register r1 is $c_{62}$ and that of register r0 is $c_{63}$. In practice, R-encoder 22 may contain multiple R-encoder modules for generating R-codewords in parallel.

The nQ=64 SDSs obtained following R-encoding are stored in memory 20 of apparatus 13 and are output to tape layout module 14. It will be appreciated that the FIG. 7 arrays corresponding to SDSs are logical arrangements only and need not be physically constructed as such. It suffices that block formatter 21 can logically combine column codewords to form the L SDSs for R-encoding, supply appropriate symbols to R-encoder 22, and store the resulting R-parity symbols such that the logical arrays corresponding to SDS blocks can be identified.

Figure 10:
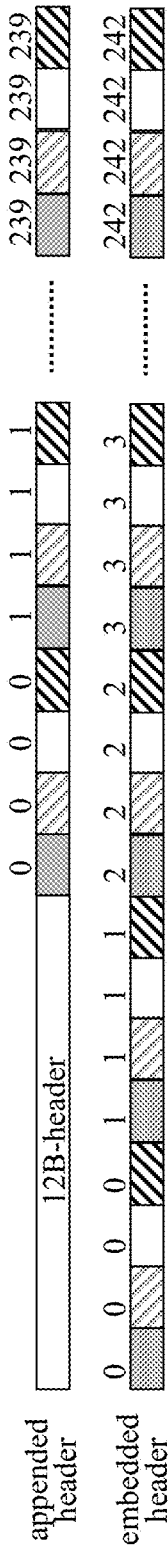
FIG. 10 illustrates packet structures with appended and embedded headers.
Figures 9, 11:
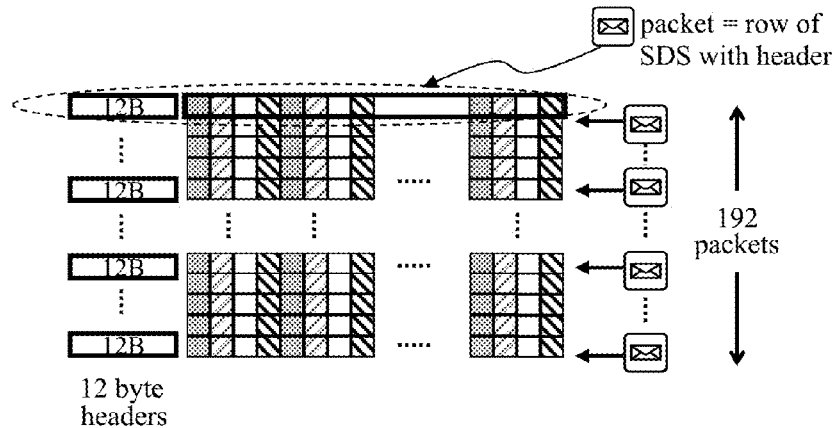
FIG. 9 illustrates formation of packets from encoded blocks.
FIG. 11 indicates allocation of row identifiers to rows of encoded blocks in a packet interleaving operation.

The nQ=64 SDSs of the Data Set are stored in memory 24 of tape layout module 14. Packet formatter 25 produces packets from the SDSs as indicated schematically in FIG. 9. In this embodiment, each packet contains one row of an SDS plus 12-bytes of header data. Hence P=192 packets are produced from each SDS here. Headers may be included in the packets in various ways, two examples being illustrated in FIG. 10. The upper diagram in this figure shows simple appending of the header to the SDS row. The 240 symbols of the four interleaved C1 row codewords in the SDS row are labeled 0 to 239. The header may also be embedded in the SDS row encoding as indicated in the lower diagram of FIG. 10. In this case, packet formatter 25 recalculates the C1 parity as a function of both the C1 payload (symbols 0 to 239 in the upper diagram) and a fragment of the 12-byte header. Each one of the four C1 codewords thus embeds 12/4=3 header bytes in this example, giving row codewords with symbols labeled 0 to 242 in the figure. The RS (240,228) C1 row code before embedding thus becomes an RS (243,231) C1' row code after embedding the 3-byte header fragment. In this way, the C1'-parity also protects the header bytes, while C2 - and R-codewords do not contain header bytes. The SDS-based coding of this embodiment also offers improved protection against burst errors. For a C1 code length of 240 in a prior system using only C1/C2 coding, 240-byte burst errors anywhere in an SDS row result in 240 C2-codewords each having a single-byte error. With the SDS-based coding and a length-240 C1 code, 240-byte burst errors anywhere in an SDS row result in 240 C2-codewords each having a single-byte error and 240 R-codewords each having a single-byte error. More generally, m-byte bursts along a tape track are always dispersed into exactly m R-codewords. Burst errors along tape tracks are therefore distributed uniformly (i.e. randomized) in C2-and R-codewords.

The packet interleaver 26 of layout module 14 operates to interleave the resulting packets for the nQ=64 SDSs of the Data Set and to output the interleaved packets to the Q=32 write-channels 15. Each packet, containing a row numbered 0 to (P−1) of an SDS numbered v=0 to (nQ−1), is assigned a row identifier (referred to in LTO drives as a "CWI-4 identifier") y. For P=192 and nQ=2Q=64 here, there are 12288 rows/packets. These are assigned identifiers y=0 to ((nQP−1)=12287) according to the table of FIG. 11. The SDS number v can be computed from the identifier y by v=mod(y, nQ), i.e. v=mod(y, 2Q) here, where the function mod(a,b) represents the remainder of dividing a by b. Hence the rows of SDS number v=0, bounded by the bold line in the table, are assigned identifiers y=0, 64, 128, . . . , etc. Row number 0 of all SDSs v=0 to 63, shown shaded in the table, are assigned identifiers y=0, 1, 2, . . . , etc.

The nQP=12288 packets will be written to the Q=32 tracks in 2P=384 packet sets (referred to in LTO drives as a "CWI-4 sets") each containing Q=32 packets. The Q=32 packets in each CWI-4 set are written simultaneously to respective tracks by write elements 17. The CWI-4 sets are assigned set numbers c=0 to ((2P−1)=383), and the Q tracks are assigned logical track numbers t=0 to ((Q−1)=31).

Packet interleaver 26 interleaves the 12288 packets by assigning the identifiers y to CWI-4 sets c and logical tracks t according to:

$$y=\mod(2Q \text{ floor}(c/2)+(P+1)(\mod(\mod(c,2)+\text{floor}(c/P),2)+2\mod(t+U \text{ floor}(c/2),Q)), 2QP)$$

where the function floor(x) is the largest integer not greater than x, and U is a parameter used to rotate tracks. In general, nQP packets will be written to the Q tracks in nP packet sets (CWI-4 sets). In this case packet interleaver 26 interleaves the nQP packets by assigning the identifiers y to CWI-4 sets c and logical tracks t according to:

$$y=\mod(nQ \text{ floor}(c/n)+(P+1) (\mod(\mod(c,n)+\text{floor}(c/P),n)+n \mod(t+U \text{ floor}(c/n),Q)), nQP).$$

Thus, for given parameters n, Q, P and U, and on input t and c, the packet interleaver outputs the packet with identifier y given by the above formula to the write channel 15 corresponding to logical track t, whereby the packets on each channel are output in order of CWI-set number c.

Figure 12:
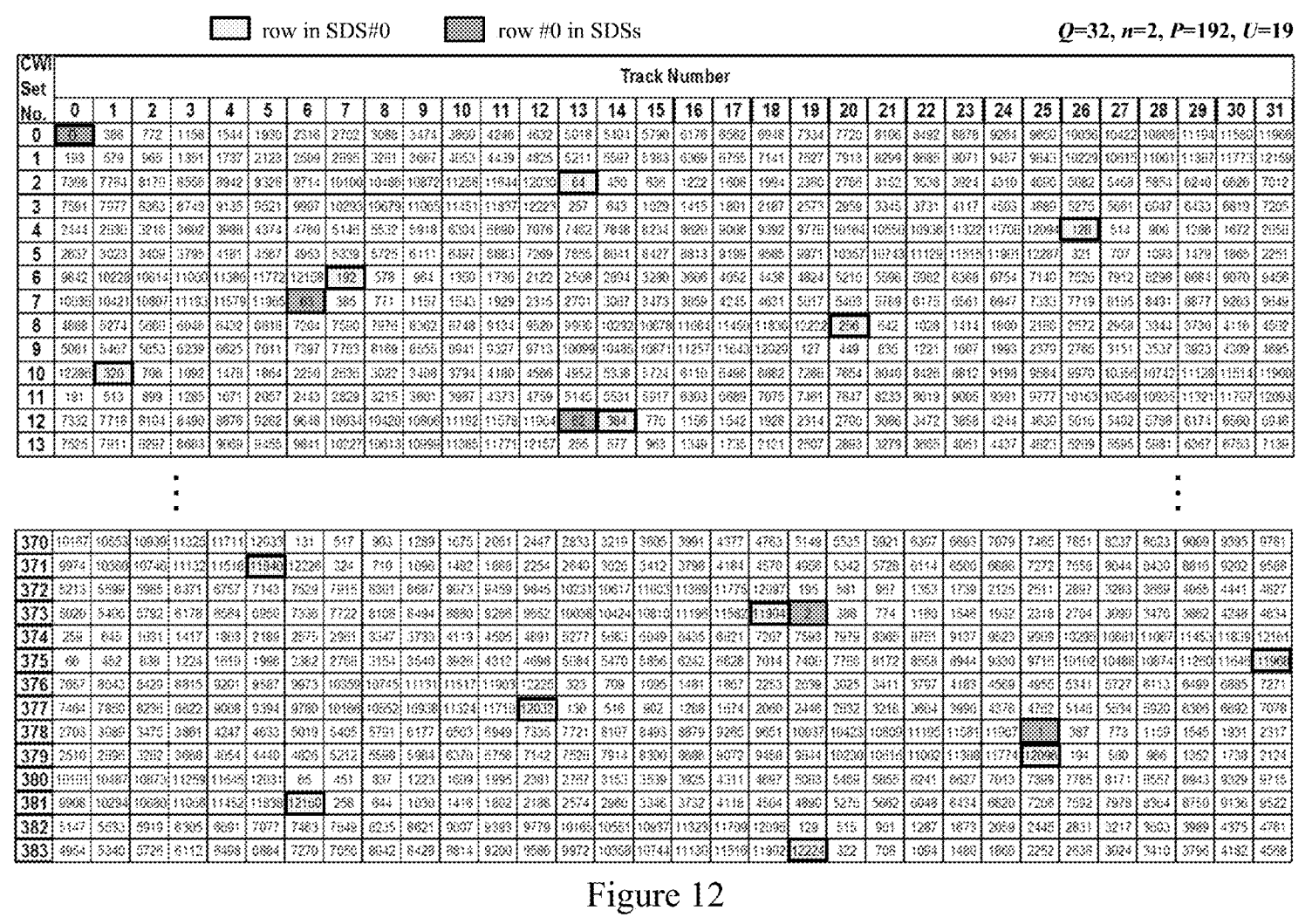
Figure 13:
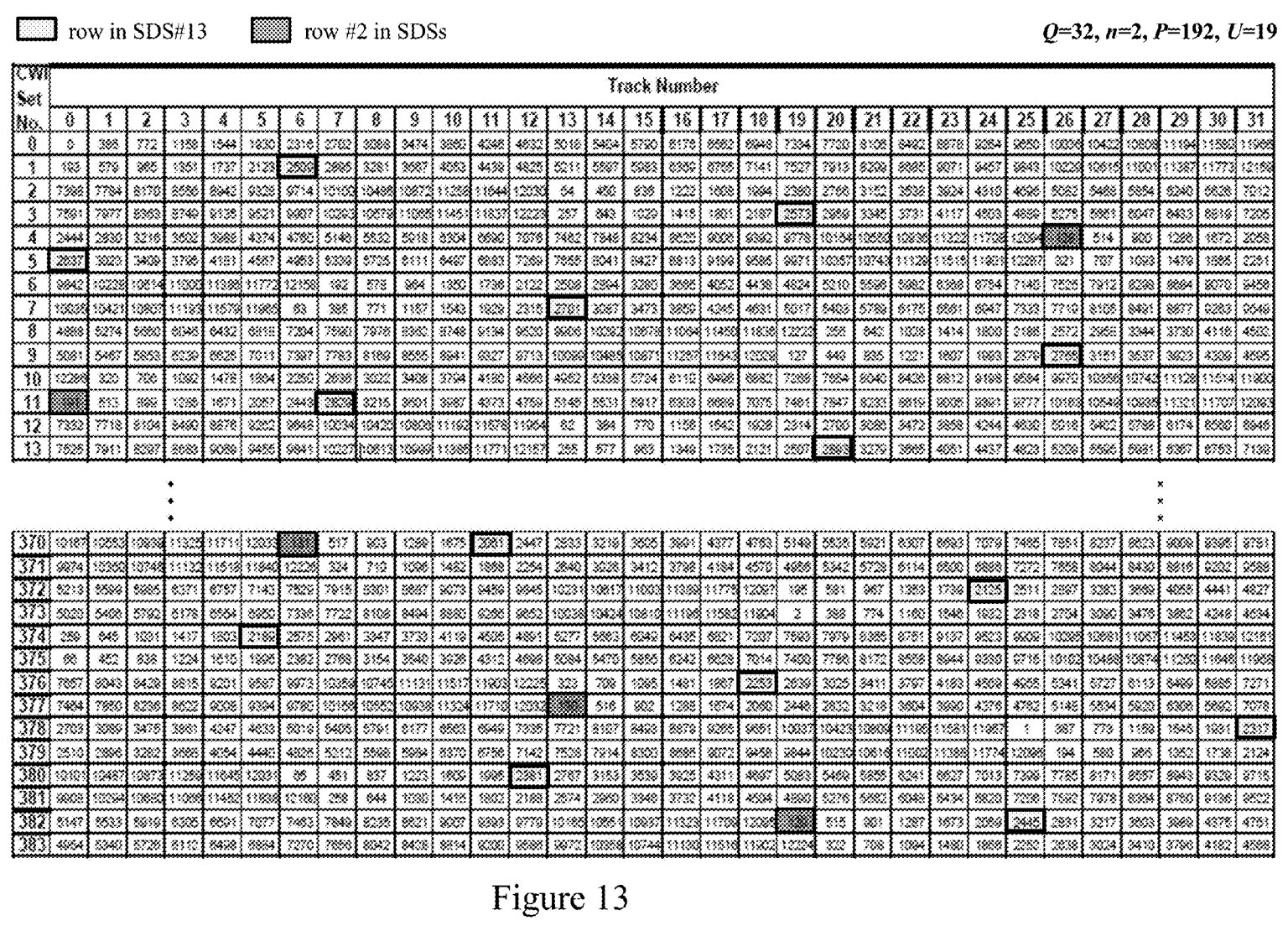

FIG. 12 shows a portion of the resulting interleave table indicating the assignment of packets with CWI identifiers y to CWI sets c=0 to 383 and logical tracks t=0 to 31 for parameters n=2, P=192, Q=32, and U=19 in this example. CWI identifiers corresponding to rows/packets from SDS number 0 are bordered in bold in the table, and identifiers corresponding to row number 0 in different SDSs are shown shaded. Rows from the same SDS with other SDS numbers, and other row numbers in each SDS in the Data Set, are spaced in corresponding fashion throughout the table. As illustration, FIG. 13 shows the interleave table with rows in SDS number 13 bordered in bold, and row number 2 in different SDSs shown shaded. It can be seen that, when the interleaved packets are written to the Q=32 tracks, the rows of each SDS will be spaced over the region of the tape in which the Data Set encoding the original input data block is written. Corresponding rows of the nQ SDSs are also spaced over this region of the tape. In general, the interleave operation can be adapted such that the rows in each case are well-spaced over the tape. The rows may be spaced in a substantially regular pattern, and may be distributed to provide an approximately even, substantially uniform or otherwise generally wide spacing of the rows over the tape. The example shown in FIGS. 12 and 13 gives a substantially uniform spacing.

By spacing corresponding rows of all SDSs via the interleave process, symbols of the R-codewords are distributed over the tape surface, protecting these codewords against burst errors. This is in addition to the distribution of column (C2) codeword symbols resulting from the spacing of rows of each SDS.

Figure 14A:
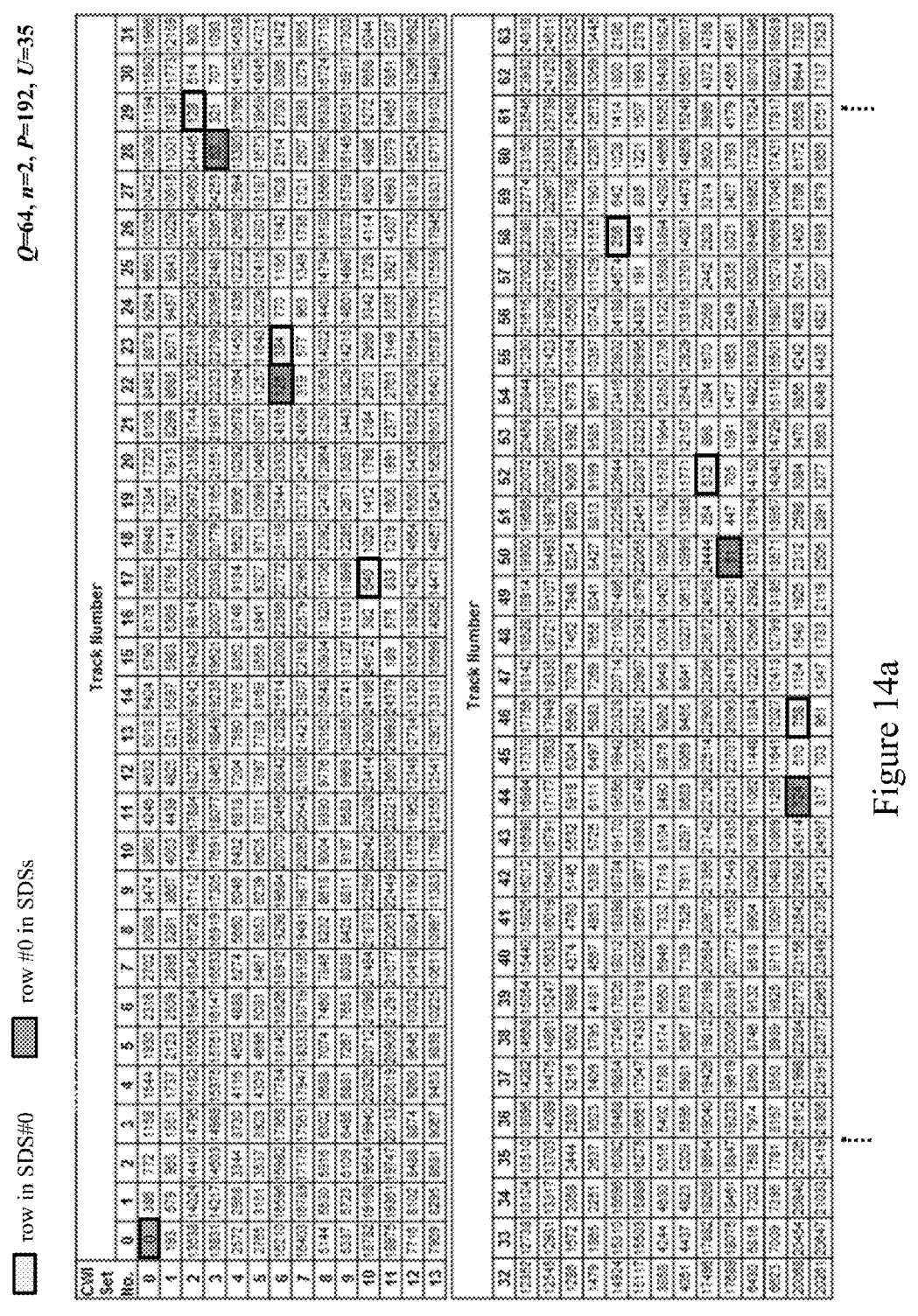
Figure 14B:
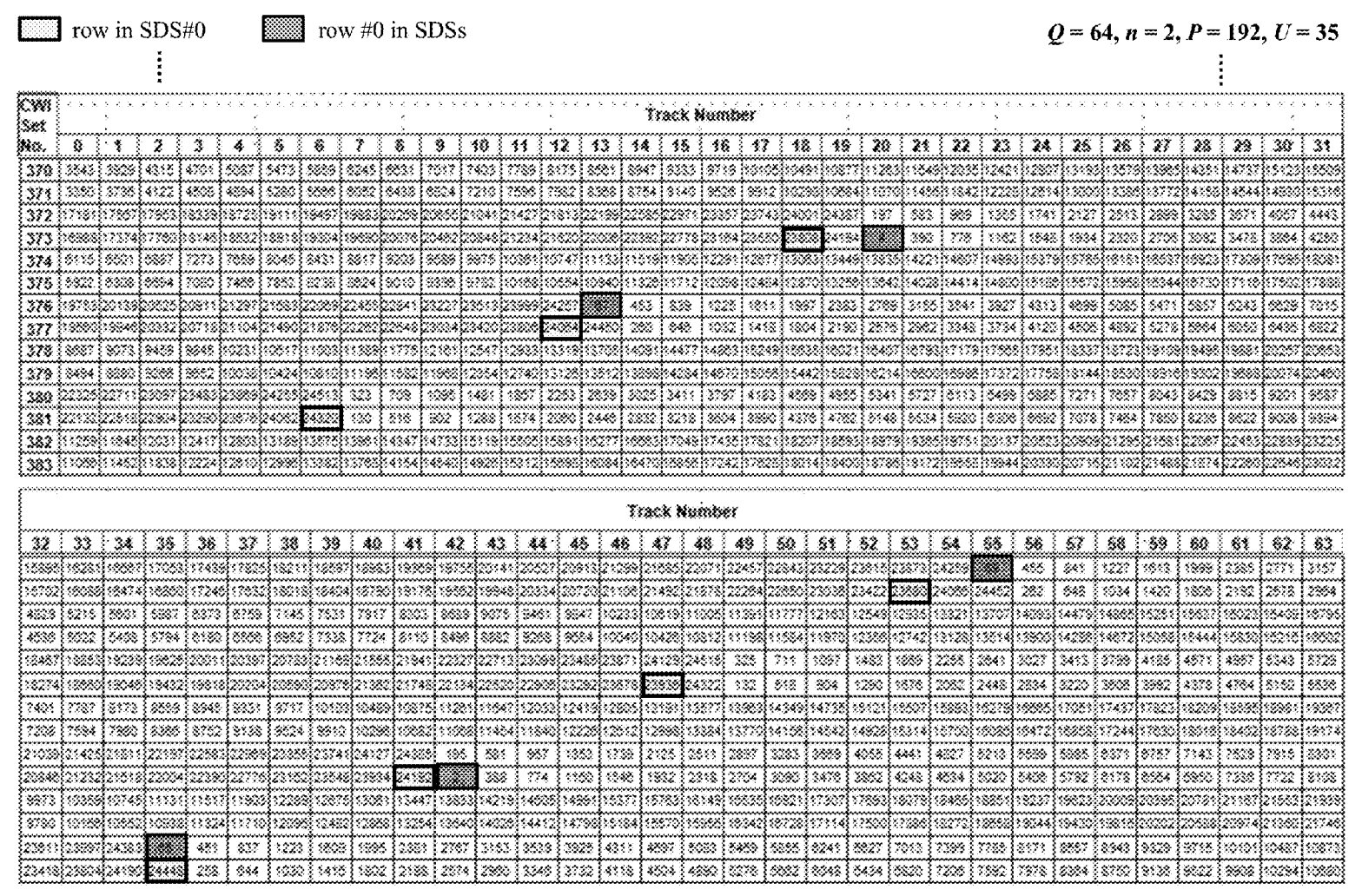

The write process can be readily extended to other values of Q. FIGS. 14a and 14b show a portion of the layout table obtained via the above process for Q=64 parallel data tracks in a 64-channel drive with parameters n=2, P=192 and U=35. The rows of SDS number 0 are bordered in bold, and row number 0 in different SDSs is shown shaded, to illustrate row spacing in this example.

Figure 7:
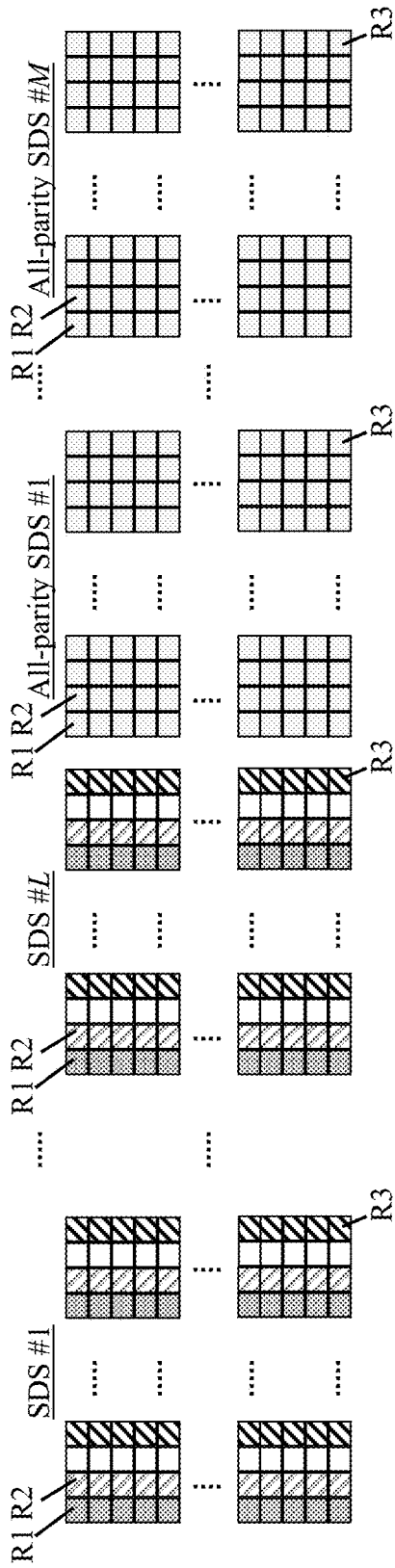
FIG. 7 illustrates rate-L/(L+M) encoding of encoded blocks.

The SDS-based coding of FIG. 7 gives a coding granularity of one SDS for the R-encoding. In an alternative embodiment, R-encoder apparatus 13 performs PCW-based encoding. In this embodiment, data partitioner 9 partitions the input data block into L sub-blocks. These are encoded by product encoder 10 to produce L product codewords which are supplied to R-encoder apparatus 13. R-encoder 22 then encodes the L PCWs using the rate-L/(L+M) code to produce M all-parity PCWs each containing one parity symbol of each of the (L+M)-symbol codewords. This process is illustrated in FIG. 15. Specifically, groups of L corresponding symbols of respective column codewords, one from each PCW, are supplied by block formatter 21 to R-encoder 22. The R-encoder encodes each group of L corresponding symbols to produce M corresponding symbols of respective column codewords, one in each of the M all-parity PCWs. The column codewords in the resulting set of L+M PCWs can then be combined to produce SDSs, preferably by column interleaving as before. In particular, block formatter 21 interleaves the column codewords in each of nQ subsets of the L+M PCWs to produce a respective SDS. The result of this process is again a set of nQ SDSs in which each column comprises a codeword of the C2 column code, and the symbols of each of the (L+M)-symbol R-codewords are distributed over corresponding rows of the nQ encoded blocks.

FIG. 16 illustrates an RS encoder for implementing R-encoder 22 in an example of the PCW-based encoding of FIG. 15. This encoder implements an RS (128, 126) code. Calculation in a finite field GF(256) is defined by the primitive polynomial $P(x)=x^8+x^4+x^3+x^2+1$. A primitive element $\alpha$ in GF(256) is $\alpha$=(0 0 0 0 0 0 1 0). The generator polynomial is $G(x)=(x+\alpha^{127})(x+\alpha^{128})=x^2+\alpha^{152}x+1$. The parity symbols are generated by processing the requisite symbols through a generator circuit whose registers are set to all-zero byte (0 0 0 0 0 0 0 0) prior to processing. Registers r0 and r1 are 8 bits wide. Data symbols (bytes) $c_0, c_1, c_2, \ldots, c_{125}$ are fed sequentially into the encoder. After the requisite symbols have been processed, the content of r1 is $c_{126}$ and that of r0 is $c_{127}$.

The PCW-based coding of FIG. 15 gives a coding granularity of one PCW for the R-encoding. The SDSs obtained following PCW-based R-encoding can be processed in similar fashion to those of the first embodiment. In particular, packets produced from rows of the SDSs preferably contain embedded headers. Advantageously in this embodiment, packet formatter 25 also cyclically rotates symbols of row codewords in each row to produce a relative cyclical shift between the row codewords in that row (and hence in each packet here). This cyclic rotation is illustrated schematically in FIG. 17 for the exemplary packets of FIG. 10. The upper diagram in FIG. 17 shows the result of cyclic rotation for the packet with appended header, and the lower diagram shows the result for the packet with embedded header. In the upper diagram, a relative cyclical shift of 60 symbols is introduced between the row codewords. In the lower diagram, a relative cyclical shift of 61 symbols is introduced between the row codewords with embedded header fragments. This provides improved protection against burst errors in this embodiment. For a length-240 C1 code, 240-byte burst errors anywhere in an SDS row result in 240 C2 codewords each having a single-byte error and 240 R codewords each having a single-byte error. Therefore, burst errors along tape tracks are again distributed uniformly (randomized) in C2 and R codewords.

The R-encoding in the above embodiments provides improved error-protection for Data Sets, inhibiting decoding failures resulting in loss of data. On-the-fly decoding is improved because additional error patterns can be corrected as a result of the R-encoding. Offline decoding can be improved by using alternative decoding strategies, e.g. decoding across different planes, during the Error Recovery Procedure (ERP). Use of the R-code also offers the capability of detecting decoding errors, i.e. mis-corrections, in a Data Set.

Figures 18A, 18B:
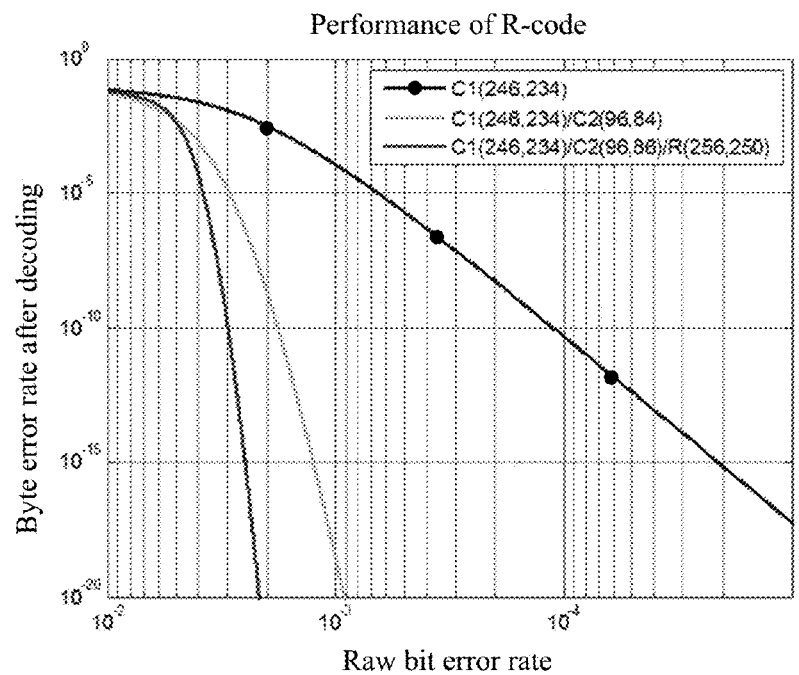
FIGS. 18a and 18b indicate error-rate performance with exemplary codes in an embodiment of the write process.

The R-encoding is accommodated in the above process while maintaining write processing stages generally in conformity with current LTO systems, thus avoiding significant processing changes. Moreover, improved error-rate performance can be achieved with minor (about 1% or less) increase in overhead, or even with no increase in overhead compared to current systems. Coding overhead can be balanced across the C1-, C2-and R-codes, permitting performance benefits to be achieved while maintaining or even reducing total ECC overhead compared to current tape drives. As illustration, FIGS. 18a and 18b illustrate performance of exemplary codes in terms of byte error rate after decoding versus raw bit error rate and raw byte error rate respectively. These graphs show results for an RS(246,234) C1 code alone and a prior C1/C2 system using the RS(246, 234) C1 code combined with an RS(96,84) C2 code. These are compared with a C1/C2/R system embodying the invention using a slightly weaker RS(96,86) C2 code and an RS(256,250) R code. The weaker C2 code allows insertion of the R overhead without increasing the total ECC overhead compared to the C1/C2 system. It can be seen that the C1/C2/R code offers improved error performance in each case, providing a two-fold increase in robustness to both raw channel bit errors and raw channel byte errors, with no increase in ECC overhead.

It will be appreciated that many changes and modifications can be made to the above embodiments. For example, other values of parameters such as U, S, L, M, n, P and Q can be readily accommodated, and numerous other examples of C1, C2 and R codes can be envisaged. The RS codes in the above examples are based on 8-bit symbols (bytes). However, RS codes based on other symbol sizes may be employed in other embodiments. Increasing the symbol size allows a corresponding increase in the RS codeword length in symbols. For example, it is envisaged that 10-bit RS symbols may be employed in future tape drives, offering the possibility of using much longer RS codes than those used in the above embodiments.

As another example, the cyclic rotation of row codeword symbols could be performed at various stages depending on whether or not packets have embedded headers. For example, when using appended headers in the PCW-based R-encoding, the cyclic rotation could be effected when interleaving column codewords of PCWs to produce SDSs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A linear tape drive for writing data in Q parallel data tracks on multitrack tape, the tape drive comprising:
   a data partitioner operable to partition a block of data into a plurality of sub-blocks each comprising a logical array having rows and columns of data symbols;
   a product encoder operable to encode the rows and columns of each sub-block using a row linear block code and a column linear block code respectively to produce a product codeword comprising a logical array of code symbols having rows which comprise respective row codewords and columns which comprise respective column codewords;
   rate-L/(L+M) encoder apparatus operable to encode the product codewords by encoding groups of L symbols, each from a respective one of L product codewords, using a rate-L/(L+M) linear block code to produce a plurality of (L+M)-symbol codewords which are logically arranged in nQ encoded blocks each comprising an array having rows and columns of code symbols in which each column comprises a codeword of said column code, wherein the symbols of each of said (L+M)-symbol codewords are distributed over corresponding rows of the nQ encoded blocks and n is an integer greater than zero;
   a packet formatter operable to produce packets from the encoded blocks, each packet comprising a row of an encoded block; and
   a write-head comprising Q write elements operable to write the packets for said block of data in said Q parallel data tracks.

2. A tape drive as claimed in claim 1 including a packet interleaver operable to interleave the packets for said block of data and to output the interleaved packets to Q write-channels for supply to respective said write elements, the packet interleaver being adapted to interleave the packets such that the rows of each encoded block are spaced over a region of the tape in which said data block is written, and such that corresponding rows of the nQ encoded blocks are spaced over said region.

3. A tape drive as claimed in claim 2 wherein the rate-L/(L+M) encoder apparatus comprises:
   a block formatter operable to combine the column codewords in each of L subsets of the product codewords to produce L said encoded blocks; and
   a rate-L/(L+M) encoder operable to encode groups of L corresponding symbols of respective column codewords, each from a respective one of said L encoded blocks, using said rate-L/(L+M) code to produce M=(nQ−L) all-parity encoded blocks each containing one parity symbol of each of said (L+M)-symbol codewords.

4. A tape drive as claimed in claim 3 wherein the data partitioner is operable to partition said block of data into L said sub-blocks whereby the product encoder produces L said product codewords, and wherein the rate-L/(L+M) encoder apparatus comprises:
   a rate-L/(L+M) encoder operable to encode the L product codewords using said rate-L/(L+M) code to produce M all-parity product codewords each containing one parity symbol of each of said (L+M)-symbol codewords; and
   a block formatter operable to combine the column codewords in each of nQ subsets of the L+M product codewords to produce a respective said encoded block.

5. A tape drive as claimed in claim 4 wherein the rate-L/(L+M) encoder is operable to encode groups of L corresponding symbols of respective said column codewords to produce M corresponding symbols of respective column codewords in respective said all-parity product codewords.

6. A tape drive as claimed in claim 5 wherein the packet formatter is operable to cyclically rotate symbols of codewords of said row code in each row of each encoded block to produce a relative cyclical shift between the row codewords in that row.

7. A tape drive as claimed in claim 1 wherein said row linear block code, said column linear block code and said rate-L/(L+M) linear block code are Reed-Solomon codes.

* * * * *